(12) United States Patent
Aigner et al.

(10) Patent No.: US 10,090,820 B2
(45) Date of Patent: Oct. 2, 2018

(54) STEALTH-DICING COMPATIBLE DEVICES AND METHODS TO PREVENT ACOUSTIC BACKSIDE REFLECTIONS ON ACOUSTIC WAVE DEVICES

(71) Applicant: RF Micro Devices, Inc., Greensboro, NC (US)

(72) Inventors: Robert Aigner, Ocoee, FL (US); Ebrahim Andideh, Portland, OR (US)

(73) Assignee: Qorvo US, Inc., Greensboro, NC (US)

( * ) Notice: Subject to any disclaimer, the term of this patent is extended or adjusted under 35 U.S.C. 154(b) by 378 days.

(21) Appl. No.: 15/078,138

(22) Filed: Mar. 23, 2016

(65) Prior Publication Data

US 2017/0033768 A1 Feb. 2, 2017

Related U.S. Application Data

(60) Provisional application No. 62/199,467, filed on Jul. 31, 2015.

(51) Int. Cl.
*H03H 9/25* (2006.01)
*H03H 3/04* (2006.01)
*H03H 3/08* (2006.01)
*H03H 9/02* (2006.01)

(52) U.S. Cl.
CPC .............. *H03H 3/04* (2013.01); *H03H 3/08* (2013.01); *H03H 9/02055* (2013.01); *H03H 9/02622* (2013.01)

(58) Field of Classification Search
CPC ........ H03H 3/04; H03H 3/08; H03H 9/02055; H03H 9/02622; B06B 1/0618; B06B 1/0622; H01L 41/0471; H01L 41/047

USPC .................................. 310/322, 364, 365
See application file for complete search history.

(56) References Cited

U.S. PATENT DOCUMENTS

| 6,943,647 | B2 | 9/2005 | Aigner et al. | |
| 8,512,800 | B2* | 8/2013 | Godshalk | H03H 9/02055 333/189 |
| 2004/0227591 | A1* | 11/2004 | Aigner | H03H 3/02 333/191 |
| 2006/0043507 | A1* | 3/2006 | Lobl | H03H 3/02 257/416 |
| 2011/0114938 | A1* | 5/2011 | Nakahara | H01L 33/28 257/43 |

(Continued)

*Primary Examiner* — Bryan Gordon
(74) *Attorney, Agent, or Firm* — Withrow & Terranova, P.L.L.C.

(57) ABSTRACT

Stealth-dicing-compatible devices and methods to prevent acoustic backside reflections on acoustic wave devices are disclosed. An acoustic wave device comprises a substrate having opposing top and bottom surfaces, where a first portion of the bottom surface has a higher roughness than a second portion of the bottom surface, and an acoustic resonator over the top surface of the substrate. The acoustic resonator comprises a piezoelectric layer having opposing top and bottom surfaces and a plurality of electrodes, at least some of which are disposed on the top surface of the piezoelectric layer. The first portion of the bottom surface of the substrate is below and opposite from the acoustic resonator, and the second portion of the bottom surface of the substrate is not located below and opposite from the acoustic resonator. Multiple first portions, each separated from the other by second portions, may exist.

23 Claims, 8 Drawing Sheets

(56) References Cited

U.S. PATENT DOCUMENTS

2014/0145558 A1\* 5/2014 Hori .................. H03H 3/02
310/313 R

\* cited by examiner

STEALTH-DICING COMPATIBLE DEVICES AND METHODS TO PREVENT ACOUSTIC BACKSIDE REFLECTIONS ON ACOUSTIC WAVE DEVICES

RELATED APPLICATIONS

This application claims the benefit of provisional patent application Ser. No. 62/199,467, filed Jul. 31, 2015, the disclosure of which is hereby incorporated herein by reference in its entirety.

FIELD OF THE DISCLOSURE

The subject matter of the present disclosure relates to fabrication of Bulk Acoustic Wave (BAW) and Surface Acoustic Wave (SAW) devices, and more specifically to methods to prevent acoustic backside reflections on BAW and SAW devices that are compatible with stealth-dicing.

BACKGROUND

Stealth-dicing is gaining popularity for singulation of wafers based on laser-induced crystal damage. The damage zones in the crystal define where the wafer separates into single dies when mechanical force/stretching is applied. Stealth-dicing offers high throughput and increases die count per wafer because dicing streets can be much narrower than with conventional blade-based sawing. For stealth-dicing to work properly, the backside of the wafer needs to be smooth to prevent optical scattering.

As used herein, the terms "front," "front side," "frontside," and "top" refer to the side of the wafer upon which the BAW devices are built during the wafer process used to construct the circuits on a semiconductor chip. The terms "back," "back side," "backside," and "bottom" refer to the side of the wafer opposite the front side.

For Bulk Acoustic Wave Solidly Mounted Resonators (BAW-SMR) devices, SAW devices, and Temperature Compensated SAW (TC-SAW) devices, having a smooth wafer backside is a liability. During operation of these devices, a small fraction ($1/1000$ to $1/10,000$) of acoustic (wave) energy penetrates into the substrate material. If the wave bounces back from the backside of the substrate, a vertical standing wave will result. Lambda ($\lambda$) is the acoustic wavelength. At frequencies where the substrate thickness equals a integer multiple of $\lambda/2$, a noticeable disturbance and/or ripple in the electrical characteristics of the filter will occur. In typical BAW devices with a 110 micrometers ($\mu m$) thick silicon (Si) substrate (after backgrinding), there will be a ripple related to backside reflections occurring approximately every 37 MHz. For a filter operating at 2.5 GHz, the acoustic wavelength in Si is about 3.3 $\mu m$. Acoustic wavelength in SAW and TC-SAW at 1 GHz is in the range of 3 $\mu m$ to 8 $\mu m$ depending on the wave type leaking out below the resonator.

One conventional technique to prevent the creation of the standing wave is to deposit an impedance matching layer on the backside of the wafer. However, the impedance matching layer will introduce a frequency dependent backside reflectivity. This may work well for bandpass filters, but for notch filters this approach is useless as it does not prevent backside reflections at low frequencies. Also, it requires additional effort and expense to deposit a well-defined layer after the back-grinding process.

Another conventional technique to prevent the creation of the standing wave is to roughen the backside of the wafer substrate using mechanical and/or chemical means, and thus disperse the reflected wave at different angles. However, after conventional roughening techniques, BAW wafers are too rough for stealth-dicing, because of the optical scattering of the roughened backside. Access to the saw streets from the frontside is not possible because grounding connections and Process Control Monitor (PCM) structures occupy the dicing streets.

Thus, stealth-dicing cannot be performed after the wafer backside has been subject to conventional roughening using mechanical and chemical means. Nor can stealth-dicing be performed before the wafer backside has been subject to conventional roughening using mechanical and chemical means: after the stealth-dicing step, the wafer is fragile and may break apart during the Therefore, there is a need for stealth-dicing-compatible devices and methods to prevent acoustic backside reflections on acoustic wave devices.

SUMMARY

The present disclosure relates to a Bulk Acoustic Wave (BAW) device comprising acoustic reflector layers or a Surface Acoustic Wave (SAW) device, with roughened backside that is limited to areas opposing all acoustic resonators, while substantial areas outside of resonators have lower roughness.

According to one embodiment of the subject matter described herein, an acoustic wave device comprises a substrate having opposing top and bottom surfaces, where a first portion of the bottom surface has a higher roughness than a second portion of the bottom surface, and an acoustic resonator over the top surface of the substrate. The acoustic resonator comprises a piezoelectric layer having opposing top and bottom surfaces and a plurality of electrodes, at least some of which are disposed on the top surface of the piezoelectric layer. The first portion of the bottom surface of the substrate is below and opposite from the acoustic resonator, and the second portion of the bottom surface of the substrate is not located below and opposite from the acoustic resonator.

In one embodiment, the acoustic wave device further comprises acoustic reflector layers disposed between the top surface of the substrate and the bottom surface of the piezoelectric layer.

In one embodiment, the acoustic wave device comprises a BAW device. In one embodiment, the acoustic wave device comprises a SAW device.

In one embodiment, the first portion is roughened using pattern programmable laser-marking equipment. In one embodiment, a pattern used in the first or second portions includes human-readable and/or machine-readable information. In one embodiment, the human-readable and/or machine-readable information comprises information that uniquely identifies the device, the device type, the date of manufacture, the time of manufacture, and/or the location of manufacture. In one embodiment, the human-readable and/or machine-readable information comprises a two-dimensional barcode, a three-dimensional barcode or Quick Response (QR) code, alphabetic characters, numeric characters, and/or symbols or patterns that contain encoded information. In one embodiment, the human-readable and/or machine-readable information is included within the first portion. In one embodiment, the human-readable and/or machine-readable information is included within the second portion.

According to another embodiment of the subject matter described herein, a method of preventing acoustic backside reflections on acoustic wave devices comprises: providing a wafer substrate having opposing top and bottom surfaces; providing an acoustic resonator over the top surface of the substrate, the acoustic resonator comprising a piezoelectric layer having opposing top and bottom surfaces and further comprising a plurality of electrodes, at least some of which are disposed on the top surface of the piezoelectric layer; and roughening a first portion of the bottom surface of the substrate to have a higher roughness than a second portion of the bottom surface of the substrate, wherein the first portion of the bottom surface of the substrate is below and opposite from the acoustic resonator and the second portion of the bottom surface of the substrate is not located below and opposite from the acoustic resonator.

In one embodiment, the roughening step is accomplished using a laser. In one embodiment, the laser is a component of pattern-programmable laser-marking equipment.

In one embodiment, the method further comprises performing stealth-dicing on the wafer substrate. In one embodiment, the stealth-dicing is performed subsequent to the roughening. In an alternative embodiment, the stealth-dicing is performed prior to the roughening.

In one embodiment, a pattern used in the first or second portions includes human-readable and/or machine-readable information. In one embodiment, the human-readable and/or machine-readable information comprises a two-dimensional barcode, a three-dimensional barcode or QR code, alphabetic characters, numeric characters, and/or symbols or patterns which contain encoded information. In one embodiment, the human-readable and/or machine-readable information is included within the first portion. In one embodiment, the human-readable and/or machine-readable information is included within the second portion.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It should be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It should also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that, although the terms "upper," "lower," "bottom," "intermediate," "middle," "top," and the like may be used herein to describe various elements, these elements should not be limited by these terms. These terms are only used to distinguish one element from another. For example, a first element could be termed an "upper" element and, similarly, a second element could be termed an "upper" element depending on the relative orientations of these elements, without departing from the scope of the present disclosure.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having meanings that are consistent with their meanings in the context of this specification and the relevant art and will not be interpreted in an idealized or overly formal sense unless expressly so defined herein.

Figure 1:
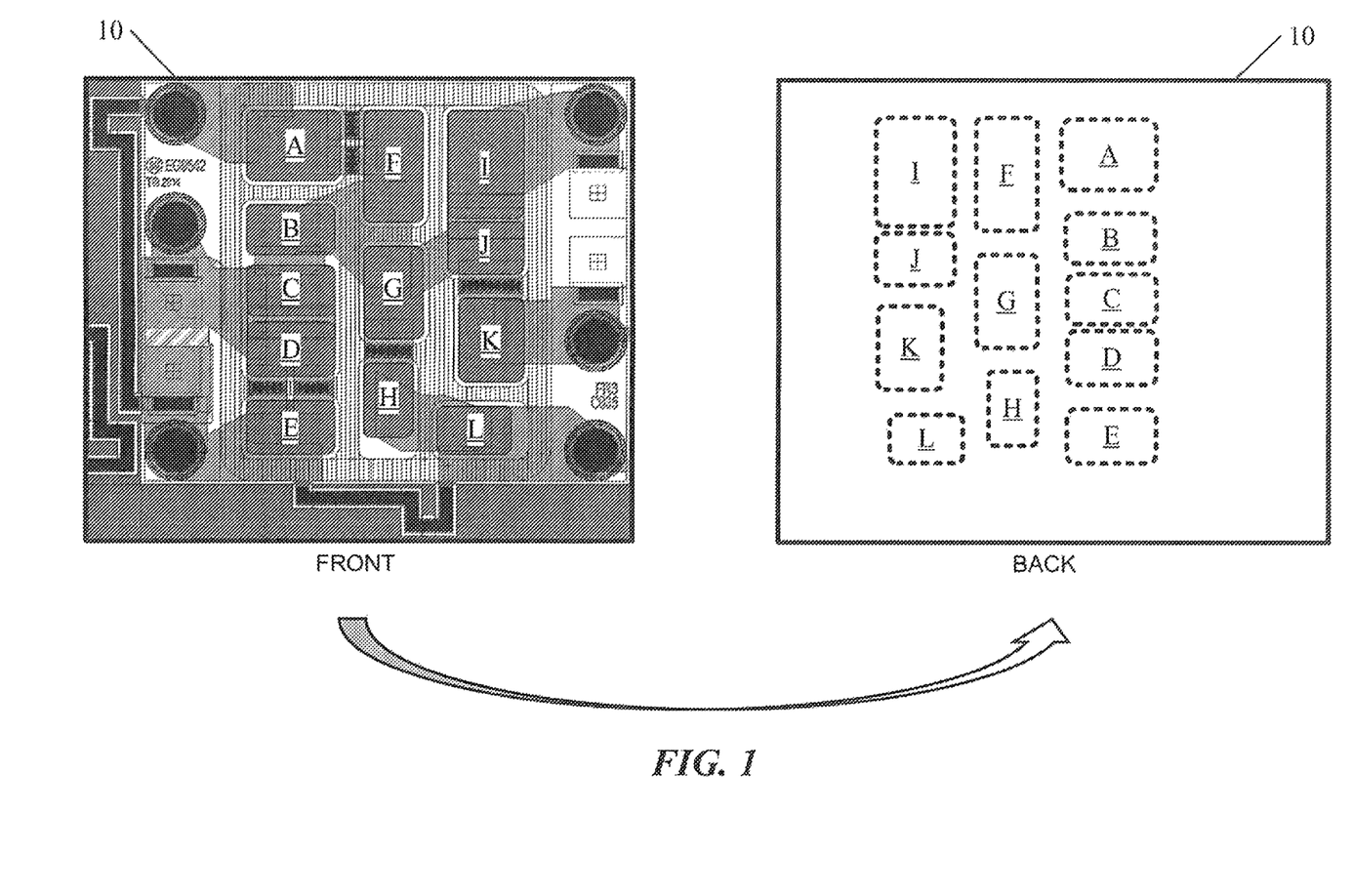
FIG. 1 illustrates front and back views of a semiconductor chip containing multiple Bulk Acoustic Wave (BAW) devices, the back view illustrating the locations of the BAW devices as viewed through the substrate.

FIG. 1 illustrates front and back views of a semiconductor chip 10 (also referred to herein as the device 10) containing multiple Bulk Acoustic Wave (BAW) devices labeled alphabetically from A through L. The image on the left is a front (or top) view of the device 10 and the image on the right is a back (or bottom) view of the same device 10. The back view includes dotted lines showing the locations of the BAW devices as if they were viewed through the substrate.

Figure 2:
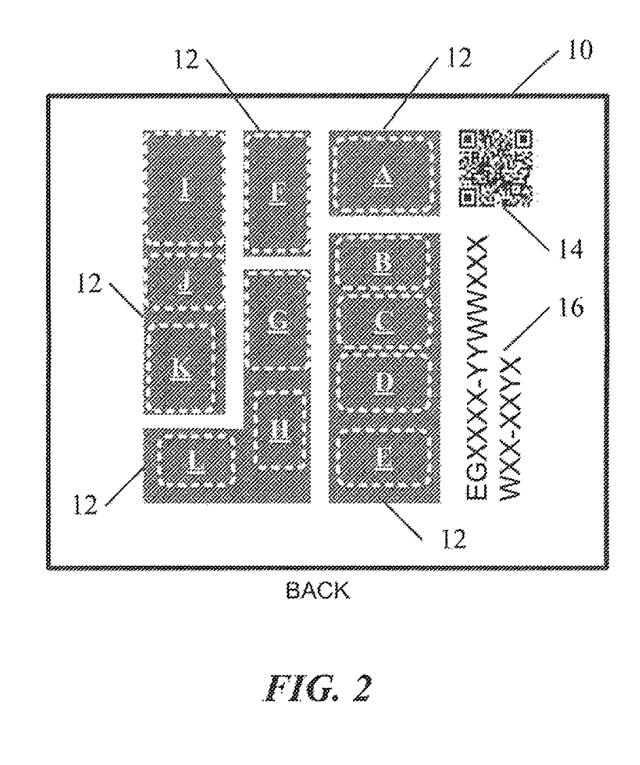
FIG. 2 illustrates a back view of the semiconductor chip containing BAW devices, illustrating the selectively roughened portions of the backside of the substrate according to an embodiment of the subject matter described herein.

FIG. 2 illustrates a back view of the semiconductor chip 10 containing BAW devices A-L, illustrating the selectively roughened portions of the backside of the substrate according to an embodiment of the subject matter described herein, with the locations of the BAW devices A-L indicated using dotted lines. In the embodiment illustrated in FIG. 2, only a subset of the total backside area—e.g., select portions 12 (also referred to herein as the portion 12, the roughened portion 12, or the laser roughened portion 12) of the substrate backside—have been roughened.

In the embodiment illustrated in FIG. 2, not all of the backside area is roughened, but only portions of the backside that are directly "underneath" or otherwise closest to the BAW devices A-L located on the front of the semiconductor chip 10. FIG. 2 illustrates the point that the roughened portion may be only just large enough to encompass a single BAW or Surface Acoustic Wave (SAW) device (such as the portion 12 which is below device A and the portion 12 that is below the BAW device F), or the roughened portion may encompass multiple devices (such as the portion 12 that is below the BAW devices B, C, D, and E, the portion 12 that is below the BAW devices G, H, and L, and the portion 12 that is below the BAW devices I, J, and K). Furthermore, the roughened portion need not match the geometry of a device or group of devices exactly. For example, the roughened portion may encompass slightly more or slightly less area than is occupied by the corresponding BAW or SAW device.

The method of the present disclosure takes advantage of the fact that backside roughness is really only needed directly opposite of where acoustic resonators are located on the frontside of the filter chip. This is typically just 30% of the total area of a BAW chip (and even less on a SAW chip). Roughness is created only in those locations; the rest of the backside remains unchanged.

A location-specific roughness has the advantage of preserving the smooth regions in the saw-streets as needed for stealth-dicing. The effective mechanical strength of the chips is enhanced as the fraction of rough back-surface decreases. Essentially, location-specific roughening leaves a framework of strong substrate beams between the roughened areas.

In one embodiment, the portions 12 are roughened using one or more lasers. For example, the roughening can be accomplished by laser-marking equipment that can be programmed to write any pattern into the backside of the wafer. This gives rise to the possibility of including other patterns or marks as well. In the embodiment illustrated in FIG. 2, the back of the wafer may also display a two-dimensional barcode, a three-dimensional barcode or Quick Response (QR) code, or other machine-readable data 14, and/or serial numbers, model numbers, alphanumeric or text data, or other human-readable data 16. Likewise, symbols or other patterns that contain encoded information may be place or inscribed using the lasers. An additional benefit of laser-marking into the backside of the chips is that full traceability of product chips to lot/wafer/stepper-shot can be achieved without additional cost. For example, information that uniquely identifies the device, the type of device, and/or the date, time, and/or location of manufacture may be included in the laser-created marking.

Figure 3:
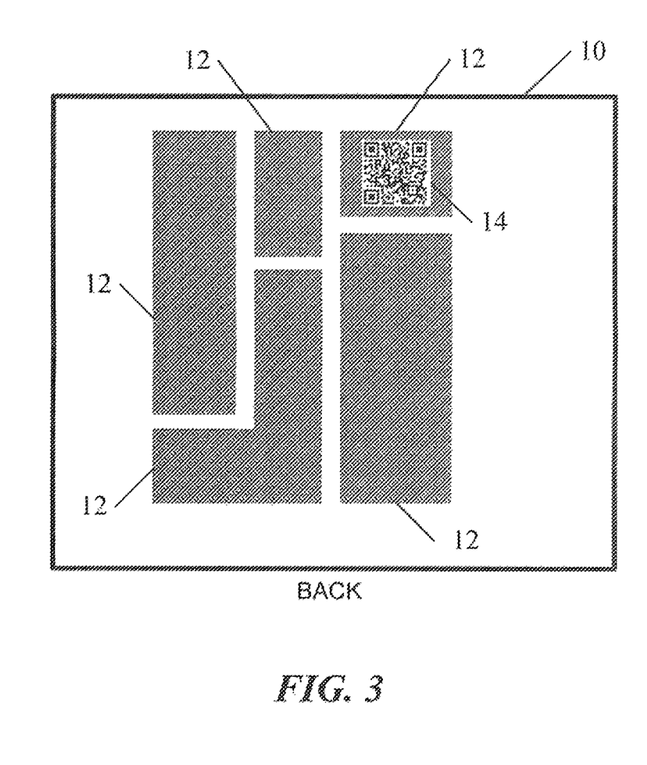
FIG. 3 illustrates a back view of the semiconductor chip containing BAW devices, illustrating the selectively roughened portions of the backside of the substrate according to another embodiment of the subject matter described herein.

FIG. 3 illustrates a back view of the semiconductor chip 10 containing the BAW devices A-L, illustrating the selectively roughened portions of the backside of the substrate according to another embodiment of the subject matter described herein. In the embodiment illustrated in FIG. 3, the machine-readable data 14 may be located within a roughened portion 12. The machine-readable data 14 image may have a regular or irregular pattern that is sufficiently "rough" to serve the intended purpose of roughened portions 12.

Roughness. There are many metrics by which roughness may be measured or characterized. $R_A$ is defined as the arithmetic average of absolute values of height or depth. $R_T$ is defined as the maximum height of the profile, i.e., the difference between the highest peak measured and the deepest trough measured. Roughness may be defined in terms of the spatial density of the peaks and valleys, i.e., how close they are to one another. To effectively prevent acoustic signal reflection from the backside of the filter, in one embodiment, the laser-roughened surface disclosed herein includes one or more peak and valley pairs within 2 wavelengths ($2\lambda$) of the filter operating frequency. For a filter fabricated on a silicon wafer and operating at frequency of 2 GHz ($\lambda$=4.1 μm), for example, the roughened surface is designed to include a minimum of one peak and one valley within 8.2 μm. In one embodiment, the laser-roughened surfaces of the instant application may have an $R_A$ value between 25 nm to 500 nm inclusive.

The subject matter described herein has several advantages over prior art mechanical and/or chemical roughening methods. The backside surface may be roughened using laser marking equipment that already exists, in which case no additional hardware is required. Marking lasers are already programmable to produce an arbitrary pattern, so programming the lasers to produce a roughening pattern should not require significant updates to the laser marking software, if at all. The laser-roughening method is a "dry" method, unlike mechanical and chemical techniques, which involve the application of liquids such as abrasives, caustics, and/or rinses. Using a laser to roughen the wafer backside also increases the mechanical strength of the chip, not only because less surface area of the wafer is subject to roughening but also because the laser roughening process is less mechanically stressful than traditional mechanical and/or chemical methods.

To reduce processing time and increase throughput, a single laser may be split into multiple beams, or multiple lasers may be operated in parallel, each beam processing a different portion of the area to be roughened.

Nevertheless, there are time and resource tradeoffs that may be made to fine tune the roughening process. For example, it takes time to laser-roughen portions of the wafer backside; the time taken by the roughening step may be reduced by minimizing the area to be treated by the laser. However, treating only selected portions of the entire backside surface may involve creating complicated maps or patterns, which involves additional up-front overhead. Where multiple lasers are used to perform the roughening, the pattern must also be programmatically split up or divided among the lasers, requiring additional overhead. In addition, using minimum areas requires precise mapping of the pattern to the wafer, which may require significant amounts of calibration of the wafer position to the laser position. If the portion to be roughened is of a sufficiently small percentage of the total area, using small, precise patterns may be the optimal approach. Some alternative approaches are illustrated in FIGS. 4 and 5.

Figure 4:
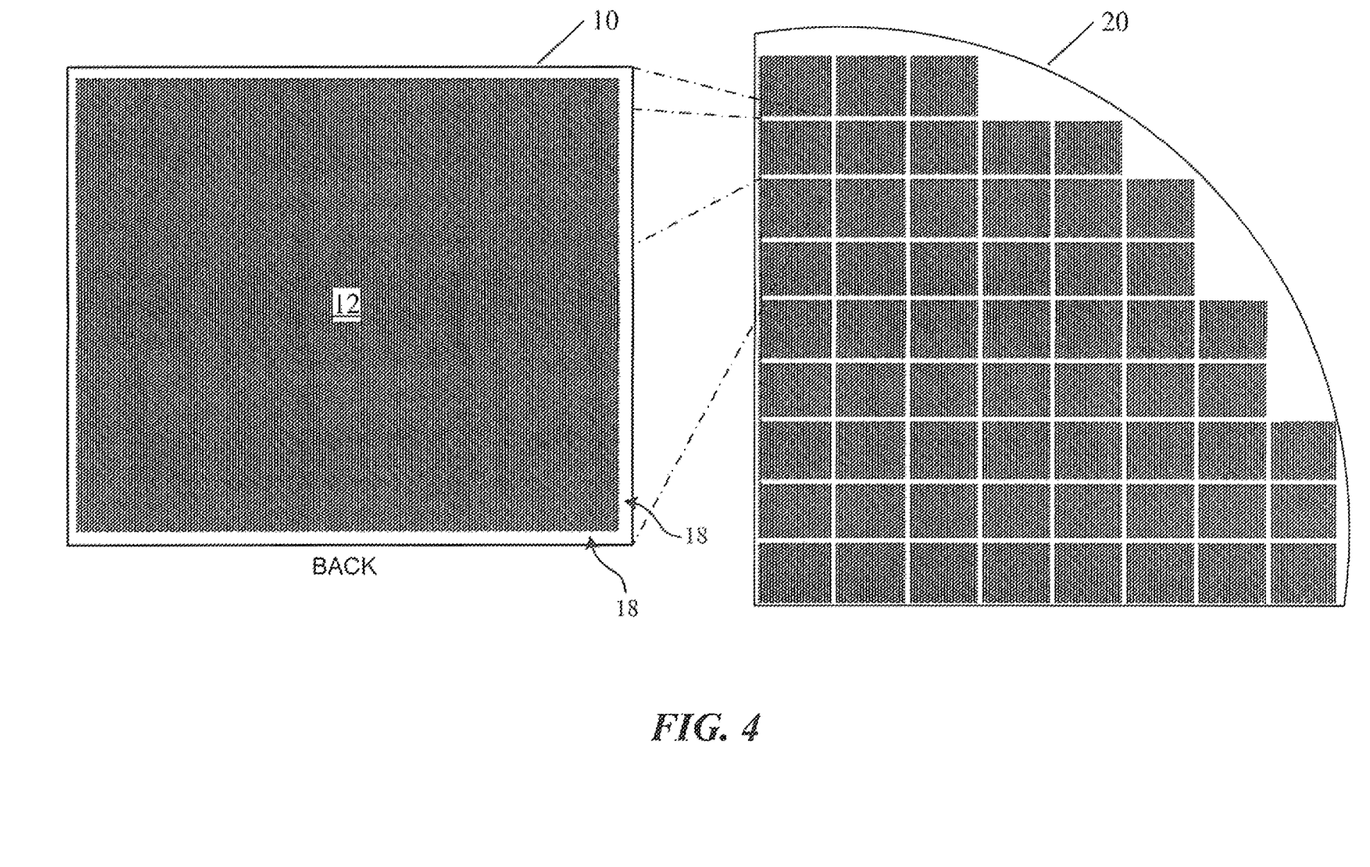
FIG. 4 illustrates a back view of the semiconductor chip containing BAW devices, illustrating the selectively roughened portions of the backside of the substrate according to yet another embodiment of the subject matter described herein.
Figure 5:
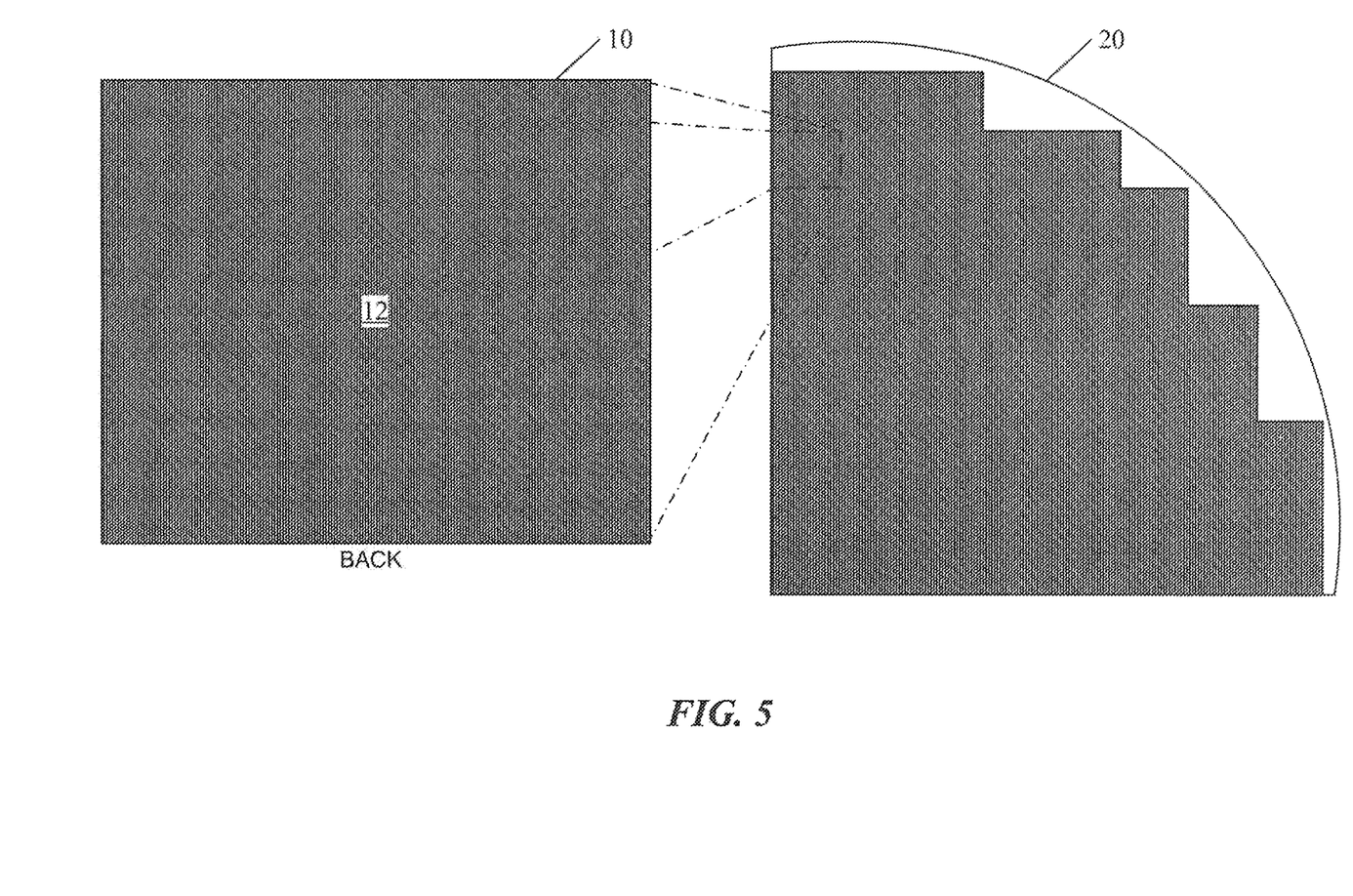
FIG. 5 illustrates a back view of the semiconductor chip containing BAW devices, illustrating a fully roughened the backside of the substrate according to yet another embodiment of the subject matter described herein.

FIG. 4 illustrates a back view of the semiconductor chip 10 containing the BAW devices A-L, illustrating the selectively roughened portions of the backside of the substrate according to yet another embodiment of the subject matter described herein. In FIG. 4, almost the entire area of the wafer backside has been laser roughened, except for dicing streets 18, which surround the roughened portion 12. Because the exact positions of the BAW devices A-L is not important, their positions on the semiconductor chip 10 are not shown. Viewed in situ with the other chips on the same wafer 20, a portion of which is shown in FIG. 4, the dicing streets 18 are seen as a grid of smooth horizontal and vertical lines.

This technique may be appropriate when the overhead associated with the minimalist approach described above is more expensive than simply creating a simple pattern that covers the entire backside except for the dicing streets 18. Such a pattern can be more easily achieved using multiple lasers and especially by a single laser that is split into multiple beams for higher throughput because each beam will be producing a pattern that is essentially identical.

The patterns of roughening (and optionally marking) the backside of the wafer illustrated in FIGS. 2, 3, and 4 are compatible with stealth-dicing because the dicing streets 18 are smooth enough such that the laser beam used to perform stealth-dicing is not dispersed and therefore effective to damage the crystal structure sufficiently to achieve the desired purpose of stealth-dicing (or any dicing), i.e., to provide a fault line along which the wafer will break when mechanical stress is applied, e.g., during Dice-Break-Expand (DBE) operations.

However, because the laser-roughening techniques disclosed herein do not subject the wafer to the same mechanical stresses as conventional mechanical and/or chemical roughening methods do, the order of the stealth-dicing and laser-roughening steps are interchangeable. Unlike conventional methods, where the mechanical/chemical roughening step must occur prior to the dicing operation, the laser-roughening techniques described herein may be performed either before the stealth-dicing step or after the stealth-dicing step.

Where the laser-roughening step is performed after the stealth-dicing step, there is no need to maintain or provide for smooth dicing streets, since the stealth-dicing step has already occurred. In these embodiments, a roughening pattern such as the one shown in FIG. 5 may be used.

FIG. 5 illustrates a back view of the semiconductor chip 10 containing BAW devices, illustrating a fully roughened backside of the substrate according to yet another embodiment of the subject matter described herein. In one embodiment, stealth-dicing occurs before roughening, and therefore the entire area of the backside of the semiconductor chip 10 is covered with the roughening pattern 12. Viewed in situ with the other chips on the same wafer 20, a portion of which is shown in FIG. 5, it can be seen that there are no visible dicing streets. In these embodiments, the stealth-dicing is truly stealth, i.e., the grid of fault lines along which the wafer 20 will be broken into individual chips is invisible or nearly so.

Figure 6:
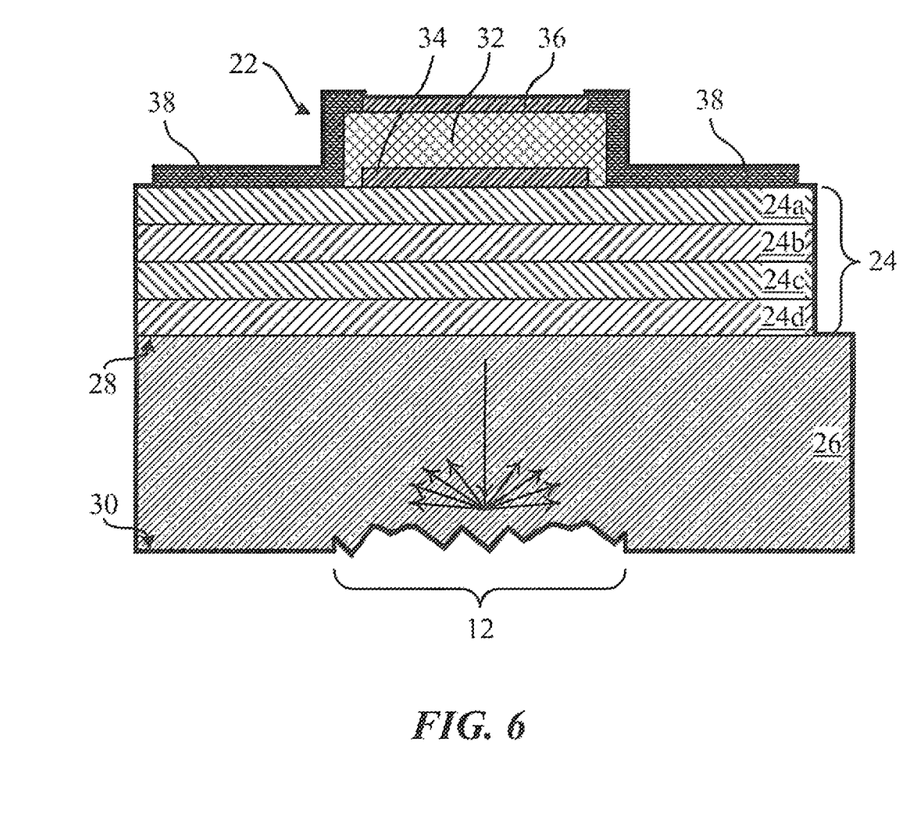
FIG. 6 illustrates a cross-sectional view of an exemplary BAW resonator constructed on a wafer having a roughened portion according to an embodiment of the subject matter described herein.

FIG. 6 illustrates a cross-sectional view of an exemplary BAW resonator constructed on a wafer having a roughened portion according to an embodiment of the subject matter described herein. In the embodiment illustrated in FIG. 6, BAW resonator 22 uses reflective layers 24a, 24b, 24c, and 24d, collectively referred to as an acoustic mirror 24, to acoustically isolate the resonator from the substrate 26 having a top surface 28 and a bottom surface 30. Acoustic mirror 24 overlies the top surface 28 of the substrate 26. The resonator further comprises a piezoelectric layer 32 interposed between a first electrode 34 and a second electrode 36, and a protective layer 38. In one embodiment, the piezoelectric layer 32 comprises a piezoelectric material that can be fabricated as a thin film. Examples of thin-film piezoelectric material include, but are not limited to, zinc-oxide (ZnO) and aluminum nitride (AlN). Other piezoelectric materials may also be used, including non-thin-film materials.

In the example shown in FIG. 6, the acoustic mirror 24 comprises two pairs of layers, each pair comprising a layer of material having a low acoustic impedance (24a and 24c) and a layer of material having a high acoustic impedance (24b and 24d). The number of layers in the acoustic mirror can be varied in order to optimize the mirror stack with regard to properties other than the minimization of the reflection of acoustic waves in the substrate. Examples of materials having low acoustic impedances include, but are not limited to, silicon oxide (SiO2), poly-silicon, aluminum (Al), or a polymer. Examples of materials having a high acoustic impedance include, but are not limited to, gold (Au), molybdenum (Mo), or tungsten (W). The ratio of the acoustic impedances of consecutive layers is large enough to permit the impedance of a substrate to be transformed to a lower value. As a result, the substrate 26 may be comprised of various high acoustic impedance materials or low acoustic impedance materials (e.g., Si, SiO2, GaAs, glass, or a ceramic material). The number of layers in an acoustic mirror can vary broadly depending on the degree of acoustic isolation required for the respective filter device. Usually three to up to nine layers are used, wherein uneven and even numbers of layers are possible.

In the embodiment illustrated in FIG. 6, the roughened portion 12 is limited to the portion of substrate 26 that is directly below the BAW resonator 22. As described above, in alternative embodiments the laser-roughened portion 12 may cover the less of, more of, or even the entirety of, the bottom surface 30.

Figure 7:
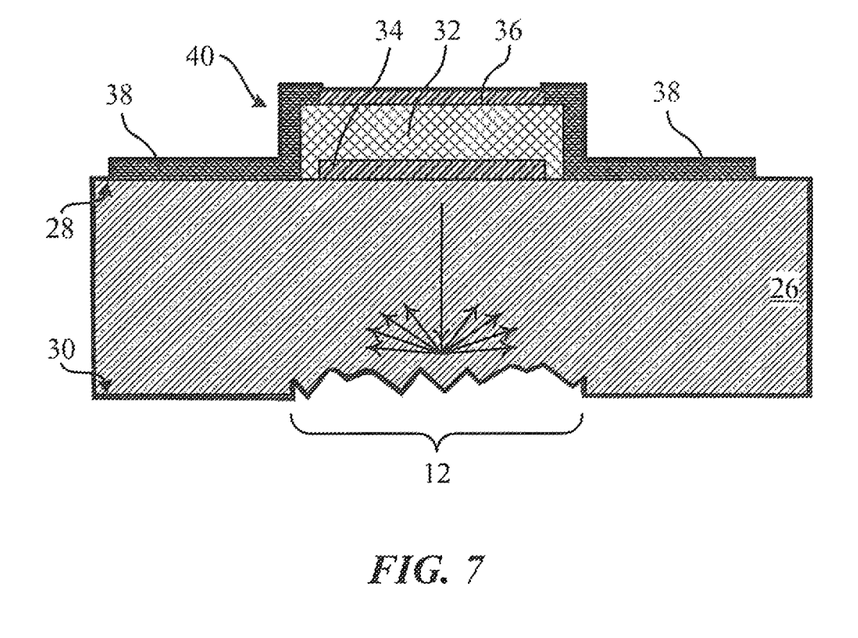
FIG. 7 illustrates a cross-sectional view of an exemplary BAW resonator constructed on a wafer having a roughened portion according to another embodiment of the subject matter described herein.

FIG. 7 illustrates a cross-sectional view of an exemplary BAW resonator constructed on a wafer having a roughened portion according to another embodiment of the subject matter described herein. FIG. 7 illustrates a BAW resonator 40 having many of the same features of the BAW resonator 22 illustrated in FIG. 6 (where like numbered elements have like functions, whose descriptions will therefore not be repeated here), but without the acoustic mirror 24. It should be noted that the topologies illustrated in FIGS. 6 and 7 are intended to be illustrative and not limiting. The use of lasers to create the roughened portion(s) 12 modifies the surface of the backside of the wafer substrate 26; therefore, the laser-roughening technique is applicable to any structure that happens to exist on the frontside of the wafer, i.e., it may be used with any BAW and SAW devices of any topology, design, or structure, and may be used to roughen the backside surface of any kind of semiconductor device, not just acoustic wave devices.

Figure 8:
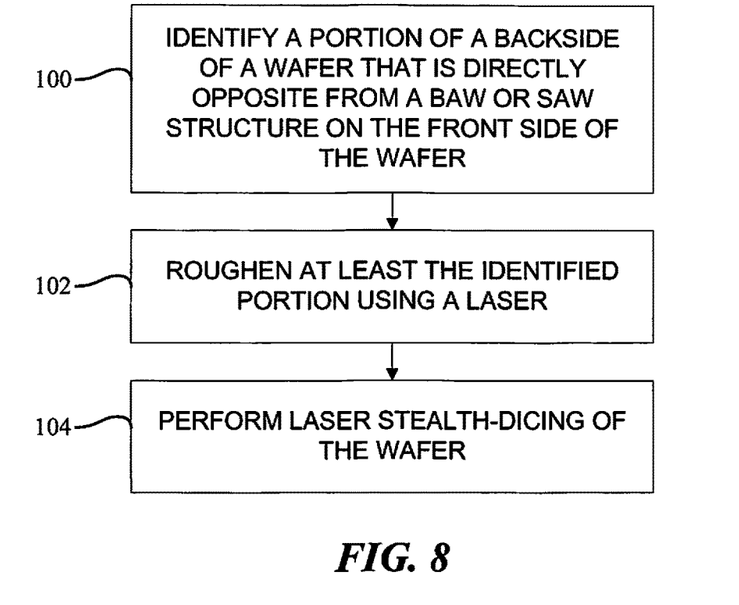
FIG. 8 is a flow chart illustrating an exemplary method for preventing acoustic backside reflections on BAW and Surface Acoustic Wave (SAW) filters according to an embodiment of the subject matter described herein.

FIG. 8 is a flow chart illustrating an exemplary method for preventing acoustic backside reflections on BAW and SAW filters according to an embodiment of the subject matter described herein. In the embodiment illustrated in FIG. 8, the process includes: identifying a portion of a backside of a wafer that is directly opposite from a BAW or SAW structure on the front side of the wafer (step 100); roughening at least the identified portion using a laser (step 102); and performing laser stealth-dicing of the wafer (step 104). FIG. 8 illustrates the point that, when only a portion of the wafer backside is roughened, stealth-dicing can be performed after the roughening step, e.g., because the roughened portion does not encroach into the dicing streets, which remain smooth enough to be effectively treated by the stealth-dicing laser.

Figure 9:
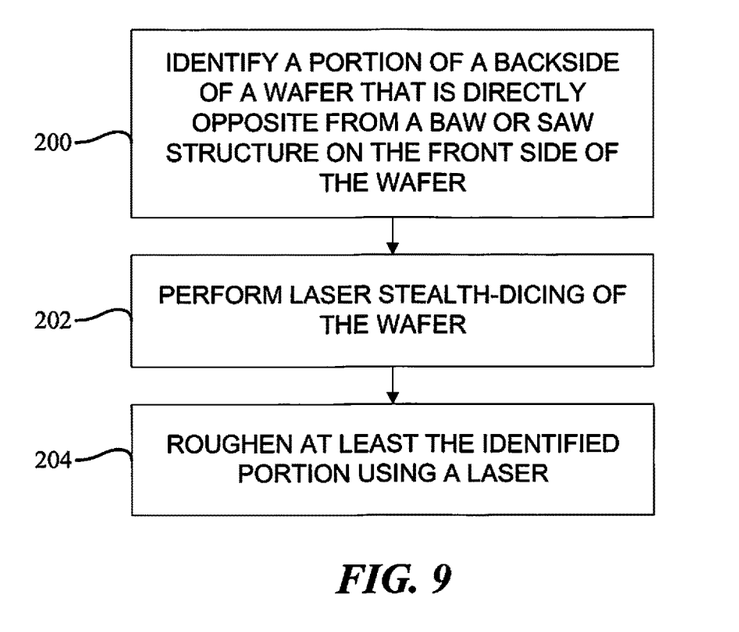
FIG. 9 is a flow chart illustrating an exemplary method for preventing acoustic backside reflections on BAW and SAW filters according to another embodiment of the subject matter described herein.

FIG. 9 is a flow chart illustrating an exemplary method for preventing acoustic backside reflections on BAW and SAW filters according to another embodiment of the subject matter described herein. In the embodiment illustrated in FIG. 9, the process includes: identifying a portion of a backside of a wafer that is directly opposite from a BAW or SAW structure on the front side of the wafer (step 200); performing laser stealth-dicing of the wafer (step 202); and roughening at least the identified portion using a laser (step 204). FIG. 9 illustrates the point that if the laser-roughened portions do not encroach into the dicing streets, the laser stealth-dicing may be performed after the roughening step.

Figure 10:
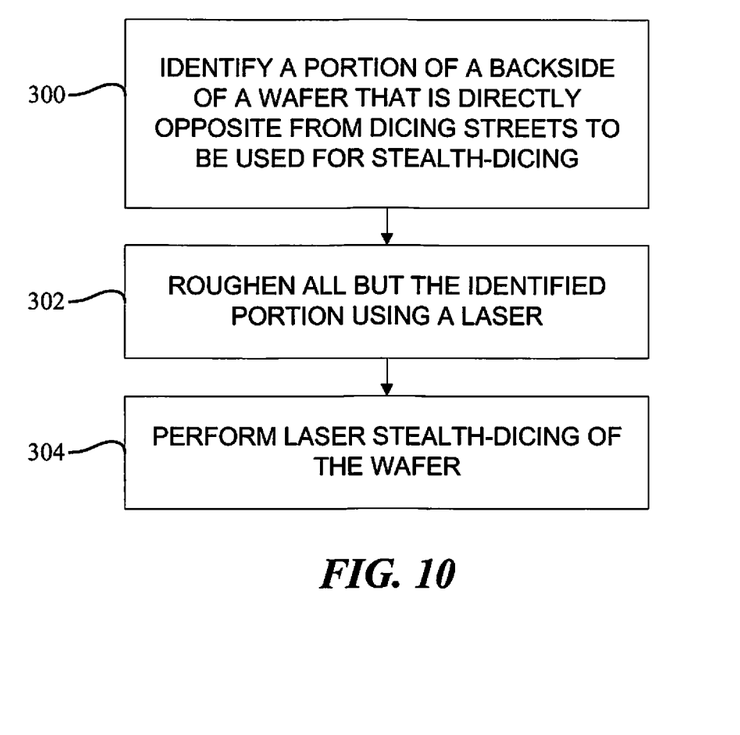
FIG. 10 is a flow chart illustrating an exemplary method for preventing acoustic backside reflections on BAW and SAW filters according to yet another embodiment of the subject matter described herein.

FIG. 10 is a flow chart illustrating an exemplary method for preventing acoustic backside reflections on BAW and SAW filters according to yet another embodiment of the subject matter described herein. In the embodiment illustrated in FIG. 10, the process includes: identifying a portion of a backside of a wafer that is directly opposite from dicing streets to be used for stealth-dicing (step 300); roughening all but the identified portion using a laser (step 302); and performing laser stealth-dicing of the wafer (step 304). FIG. 10 illustrates the point that, so long as the laser-roughened portions do not encroach into the dicing streets, the laser-roughening may roughen all but the dicing streets, after which the laser stealth-dicing may be performed.

Figure 11:
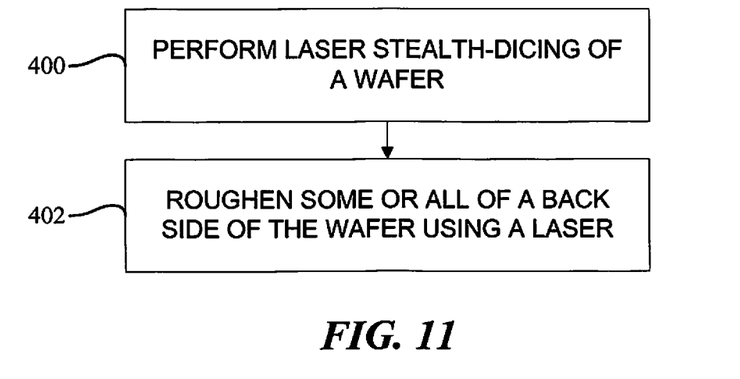
FIG. 11 is a flow chart illustrating an exemplary method for preventing acoustic backside reflections on BAW and SAW filters according to yet another embodiment of the subject matter described herein.

FIG. 11 is a flow chart illustrating an exemplary method for preventing acoustic backside reflections on BAW and SAW filters according to yet another embodiment of the subject matter described herein. In the embodiment illustrated in FIG. 11, the process includes: performing laser stealth-dicing on a wafer (step 400); and then roughening some (or all) of the back surface of the wafer using a laser (step 402). FIG. 11 illustrates the point that, where the laser stealth-dicing is performed first, the subsequent laser-roughening step can roughen a subset of the back surface but may also roughen all of the back surface, e.g., without having to leave the dicing lanes unroughened.

In some embodiments described herein, the laser used to perform laser stealth-dicing may be the same as the laser used to perform laser roughening/laser marking. Alternatively, a different laser may be used for one or more of these steps.

Those skilled in the art will recognize improvements and modifications to the present disclosure. All such improvements and modifications are considered within the scope of the concepts disclosed herein.

Those skilled in the art will recognize improvements and modifications to the preferred embodiments of the present disclosure. All such improvements and modifications are considered within the scope of the concepts disclosed herein and the claims that follow.

What is claimed is:

1. An acoustic wave device, comprising:
    a substrate having opposing top and bottom surfaces, wherein a first portion of the bottom surface has a higher roughness than a second portion of the bottom surface; and
    an acoustic resonator over the top surface of the substrate, the acoustic resonator comprising a piezoelectric layer having opposing top and bottom surfaces and further comprising a plurality of electrodes, at least some of which are disposed on the top surface of the piezoelectric layer,
    wherein the first portion of the bottom surface of the substrate is below and opposite from the acoustic resonator and the second portion of the bottom surface of the substrate is not located below and opposite from the acoustic resonator.

2. The device of claim 1 further comprising acoustic reflector layers disposed between the top surface of the substrate and the bottom surface of the piezoelectric layer.

3. The device of claim 1 wherein the acoustic wave device comprises a Bulk Acoustic Wave (BAW) device.

4. The device of claim 1 wherein the acoustic wave device comprises a Surface Acoustic Wave (SAW) device.

5. The device of claim 1 wherein the first portion is roughened using pattern programmable laser-marking equipment.

6. The device of claim 1 wherein a pattern used in the first or second portions includes human-readable and/or machine-readable information.

7. The device of claim 6 wherein the human-readable and/or machine-readable information comprises information that uniquely identifies the acoustic wave device, the device type, a date of manufacture, a time of manufacture, and/or a location of manufacture.

8. The device of claim 6 wherein the human-readable and/or machine-readable information comprises:
    a two-dimensional barcode;
    a three-dimensional barcode or Quick Response (QR) code;
    alphabetic characters;
    numeric characters; and/or
    symbols or patterns that contain encoded information.

9. The device of claim 6 wherein the human-readable and/or machine-readable information is included within the first portion of the bottom surface of the substrate.

10. The device of claim 6 wherein the human-readable and/or machine-readable information is included within the second portion of the bottom surface of the substrate.

11. A method of preventing acoustic backside reflections on acoustic wave devices, the method comprising:
    providing a substrate having opposing top and bottom surfaces;
    providing an acoustic resonator over the top surface of the substrate, the acoustic resonator comprising a piezoelectric layer having opposing top and bottom surfaces and further comprising a plurality of electrodes, at least some of which are disposed on the top surface of the piezoelectric layer; and roughening a first portion of the bottom surface of the substrate to have a higher roughness than a second portion of the bottom surface of the substrate, wherein the first portion of the bottom surface of the substrate is below and opposite from the acoustic resonator.

12. The method of claim 11 wherein the second portion of the bottom surface of the substrate is not located below and opposite from the acoustic resonator.

13. The method of claim 11 wherein the first portion of the bottom surface of the substrate encompasses the entire bottom surface of the substrate other than dicing streets reserved for stealth-dicing.

14. The method of claim 11 wherein the first portion of the bottom surface of the substrate encompasses the entire bottom surface of the substrate including the dicing streets reserved for stealth-dicing.

15. The method of claim 11 wherein the roughening step is accomplished using a laser.

16. The method of claim 15 wherein the laser is a component of pattern-programmable laser-marking equipment.

17. The method of claim 11 comprising performing stealth-dicing on the wafer substrate.

18. The method of claim 17 wherein the stealth-dicing is performed subsequent to the roughening.

19. The method of claim 17 wherein the stealth-dicing is performed prior to the roughening.

20. The method of claim 11 wherein a pattern used in the first or second portions of the bottom surface of the substrate includes human-readable and/or machine-readable information.

21. The method of claim 20 wherein the human-readable and/or machine-readable information comprises:
a two-dimensional barcode;
a three-dimensional barcode or Quick Response (QR) code;
alphabetic characters;
numeric characters; and/or
symbols or patterns which contain encoded information.

22. The method of claim 20 wherein the human-readable and/or machine-readable information is included within the first portion of the bottom surface of the substrate.

23. The method of claim 20 wherein the human-readable and/or machine-readable information is included within the second portion of the bottom surface of the substrate.

* * * * *

UNITED STATES PATENT AND TRADEMARK OFFICE
CERTIFICATE OF CORRECTION

PATENT NO. : 10,090,820 B2
APPLICATION NO. : 15/078138
DATED : October 2, 2018
INVENTOR(S) : Robert Aigner and Ebrahim Andideh It is certified that error appears in the above-identified patent and that said Letters Patent is hereby corrected as shown below:

In the Specification

In Column 2, Line 14, replace "may break apart during the" with --may break apart during the conventional roughening process--.

Signed and Sealed this
Fourth Day of December, 2018

Andrei Iancu
*Director of the United States Patent and Trademark Office*